United States Patent [19]
Opris

[11] Patent Number: 5,656,947
[45] Date of Patent: Aug. 12, 1997

[54] LOW NOISE DIGITAL OUTPUT BUFFER

[75] Inventor: Ion E. Opris, Sunnyvale, Calif.

[73] Assignee: National Semiconductor Corporation, Santa Clara, Calif.

[21] Appl. No.: 680,902

[22] Filed: Jul. 16, 1996

[51] Int. Cl.$^6$ .................................................. H03K 19/003
[52] U.S. Cl. ........................... 326/26; 326/27; 326/82
[58] Field of Search .................................. 326/21, 26, 27, 326/29, 82; 327/266, 268, 283, 287

[56] References Cited

U.S. PATENT DOCUMENTS

| | | | |
|---|---|---|---|
| 4,789,796 | 12/1988 | Foss | 307/443 |
| 4,800,298 | 1/1989 | Yu et al. | 307/443 |
| 4,818,901 | 4/1989 | Young et al. | 307/451 |
| 4,829,199 | 5/1989 | Prater | 326/27 |
| 4,943,745 | 7/1990 | Watanabe et al. | 327/266 X |
| 5,036,222 | 7/1991 | Davis | 307/443 |
| 5,081,374 | 1/1992 | Davis | 307/451 |
| 5,216,293 | 6/1993 | Sei et al. | 326/27 |
| 5,218,239 | 6/1993 | Boomer | 326/26 |
| 5,231,311 | 7/1993 | Ferry et al. | 307/443 |
| 5,469,164 | 11/1995 | Kemp | 341/145 |

OTHER PUBLICATIONS

Goro Kitsukawa et al., "A 23-ns 1-Mb BiCMOS DRAM", IEEE Journal of Solid-State Circuits, vol. 25, No. 5, Oct. 1990, pp. 1102-1111.

Howard L. Kalter, "A 50-ns 16-Mb DRAM with a 10-ns Data Rate and On-Chip ECC", IEEE Journal of Solid-State Circuits, vol. 25, No. 5, Oct. 1990, pp. 1118-1128.

*Primary Examiner*—David R. Hudspeth
*Attorney, Agent, or Firm*—Limbach & Limbach L.L.P.

[57] ABSTRACT

A digital output buffer uses an RC delay line having more than one resistor and capacitor as a shaping circuit which drives an operational amplifier configured as voltage follower that drives an output load through a bond wire according to an embodiment, thereby achieving low ground and power supply bounce and nearly constant propagation delay under all process, temperature, and capacitive load variations. In another embodiment, taps from an RC delay line are used to drive a distributed MOS source follower. In yet another embodiment, taps from the RC delay line are used to drive the distributed MOS source follower while the final tap drives a rail-to-rail operational amplifier configured as a voltage follower. In that embodiment, the operational amplifier includes a fully complementary adaptive biasing structure which allows large overdrive voltages for the output devices. Most of the load current is supplied by the distributed MOS source follower, so that the operational amplifier must only correct the output signal shape and drive the output to the relevant power supply voltage after the distributed MOS source follower cuts off one threshold voltage short of the final output voltage. In yet another embodiment, the digital output buffer having an RC delay line, a distributed MOS source follower, and an operational amplifier is a tri-state output buffer. In that embodiment, the operational amplifier output drivers are disabled and the power supplies are disconnected from the RC delay line and the distributed MOS source follower when the output buffer is disabled.

26 Claims, 10 Drawing Sheets

LOW NOISE DIGITAL OUTPUT BUFFER

BACKGROUND OF THE INVENTION

1. Field of the Invention

The present invention relates to output drivers for integrated circuits; and specifically to driving capacitive output loads external to the chip with digital levels while minimizing noise generated by parasitic bond wire lead inductance.

2. Discussion of the Related Art

Noise generated by digital switching has been identified as a significant obstacle to the acceptance of new, high speed digital devices. As switching speeds and dynamic drive capability are increased, voltage perturbations on expected-quiet outputs increase as well.

Integrated circuits typically must drive output pads which are bonded to package leads through bonding wires. Because the capacitances of circuit nodes on a circuit board are very large in comparison with most node capacitances internal to the integrated circuit, signals which are to be communicated outside the integrated circuit must be amplified by large output buffers which then drive the output pads and the potentially large capacitive loads to which the output pads are connected. Unfortunately, the bonding wires have non-zero inductances which can generate noise both inside and outside the integrated circuits to which they connect. In many integrated circuits, the current driving capabilities of the output buffers is larger than the total current driving capabilities of all the internal devices on the integrated circuit. Thus, the output buffers often constitute a large portion of the total current used by a given integrated circuit. Moreover, in synchronous circuits, often many of the output buffers switch states (from low to high or from high to low) simultaneously directly after a clock edge. Because the output buffers are large and potentially many of them are switching simultaneously, the current consumption of the integrated circuit as a whole can contain "spikes" as the output buffers change states. During these spikes, large currents flow through the bonding wires which connect to the power and ground pads. Because these power and ground bonding leads have non-zero inductances, the large changes in currents through them induce voltages across the bonding leads. Therefore, the entire power and ground supplies for the integrated circuit can "bounce" up and down.

In digital circuits, which are inherently designed to operate under circumstances of some noise, if the bounce is severe enough, noise margins are sacrificed and errors occur. In analog portions of the circuit, power and ground bouncing usually has greater impact than in digital circuits, directly affecting the accuracy of the circuits. For example, in analog circuits, the ground bounce itself is a major problem as it can modify the reference voltage levels of sensitive inputs.

Thus, high speed digital output buffers inherently produce high amounts of noise due to the bonding wire inductances. Even if the power and ground is not supplied through bonding wires, the noise produced by each output buffer is then capacitively coupled to the other sections of the circuit.

Figure 1A:
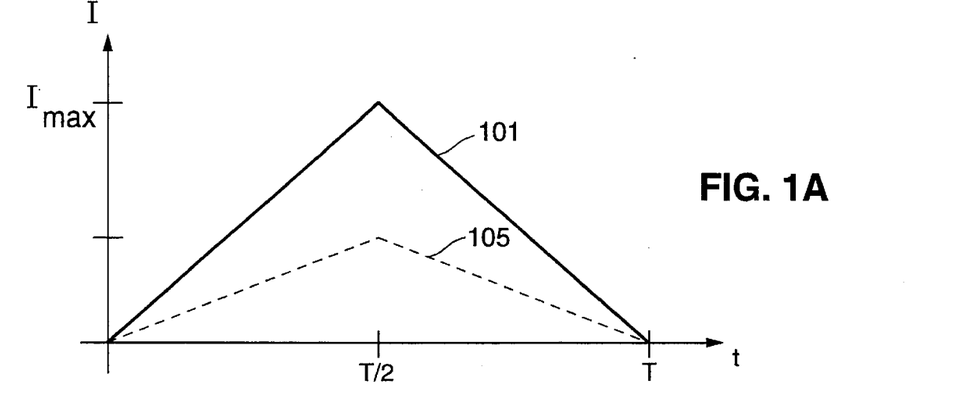
FIG. 1A illustrates an optimal output current waveform of a digital output buffer for minimizing inductively generated noise when charging a load capacitance.

The charging and discharging of the load capacitances require current pulses. Changes in the power supply or ground line currents generate voltage pulses across the series inductor. A fundamental limit for this rail bounce can be understood from FIGS. 1A, 1B, and 1C. If the output must be charged from the ground potential to +Vdd in a total period of time T, the optimal approach to accomplish this result is to gradually increase the output current from time zero to time T/2 and then decrease it back to zero from time T/2 to time T, as illustrated in current trace 101 FIG. 1A. The output voltage is given by the following equation.

$$V_{out} = \frac{1}{C} \cdot \int I_{out} dt \quad (1)$$

Figure 1B:
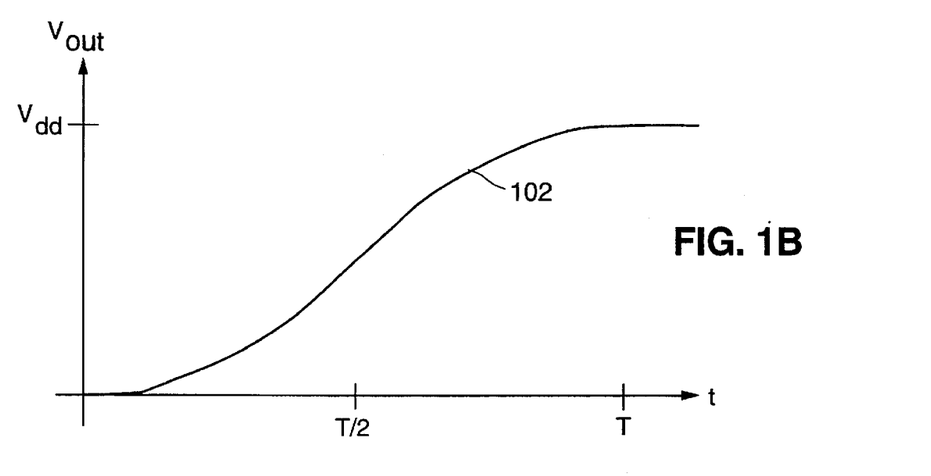
FIG. 1B illustrates the voltage waveform of the output node charged using the output current waveform illustrated in FIG. 1A.

In the above equation, C is the total output node capacitance, the maximum current Imax must satisfy the following relation so that the area underneath the current curve 101 illustrated in FIG. 1A equals is exactly enough charge to change the voltage of the capacitance C from zero to +Vdd, as illustrated by the voltage trace 102 in FIG. 1B.

$$I_{max} = \frac{2 \cdot C \cdot V_{dd}}{T} \quad (2)$$

However, changes in the output buffer load current will generate an induced voltage across the series bonding wire lead inductance according to the following equation.

$$\Delta V = L \cdot \frac{dI}{dt} \quad (3)$$

Figure 1C:
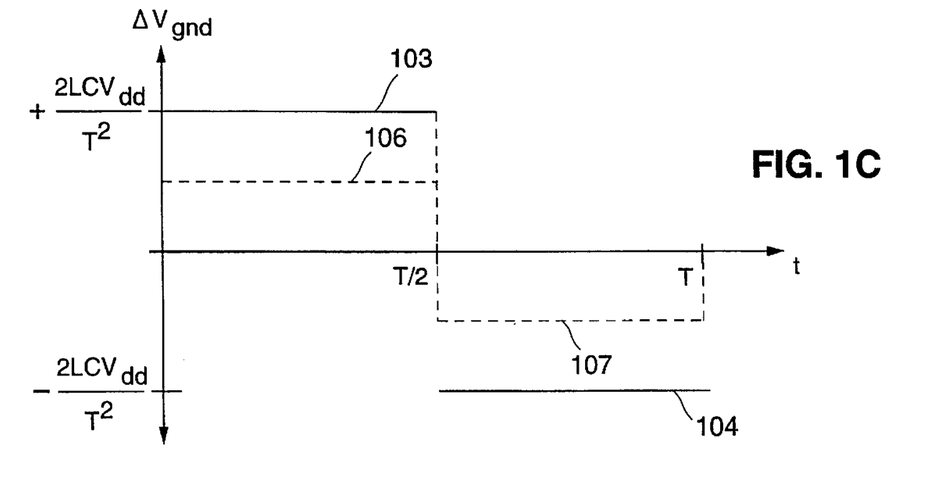
FIG. 1C illustrates the induced voltage across the series lead inductance when the output buffer charges the output node using the output current waveform illustrated in FIG. 1A.

In the ideal case, the maximum ground bounce voltage is given by the following equation, and is illustrated by the vertical voltage drop occurring at time T/2 in FIG. 1C as the induced voltage changes from the trace 103 to the trace 104.

$$\Delta V_{max} = \frac{4 \cdot C \cdot V_{dd}}{T^2} L \quad (4)$$

In real non-ideal circuits, the lead inductances act as reactive elements in an under-damped oscillating system, such that damped ringing occurs. Therefore, in realistic circuits, the peak bounce voltage is significantly higher than that given by equation (4) and illustrated in FIG. 1C.

Moreover, at high speed it is extremely difficult to generate an output current which behaves as a linear ramp as illustrated in FIG. 1A. Most designs are constrained by a maximum propagation delay in the output buffers. Most applications provide a minimum operating frequency, which provides the constraint on the maximum delay time T. This should be guaranteed under all process-voltage-temperature (PVT) conditions. The PVT "corners" represent the worst extreme cases under which the circuit may be called upon to operate. For example, in a CMOS design, slow p-type diffusion and slow n-type diffusion represent one process corner. Under all load conditions and all PVT corners and extremes, full output load charging and discharging within the maximum delay time T must be guaranteed.

However, in order to minimize the inductive noise generated, a constant delay time is preferable to a minimal delay time even though the output buffer is capable of charging faster necessary to meet the maximum delay time T. FIG. 1B illustrates that the optimal output buffer produces the same output load voltage 102 over time regardless of the size of the output load. The dotted current trace 105 in FIG. 1A illustrates the optimal output buffer current under lighter output load conditions. The dotted ground bounce voltage traces 106 and 107 In FIG. 1C illustrate that the induced ground bounce is lower under lighter load capacitance conditions. Thus, if the rate of charging and discharging could be made proportional to the output load capacitance, minimal noise would be induced. A first order analysis indicates that a constant propagation delay is desirable, since lower bounce voltages are obtainable under light capacitive load conditions.

High speed mixed-mode circuit designs include analog and digital circuitry. In such mixed-mode circuits, the importance in maintaining low noise conditions for the analog circuit sections necessitates careful design of the noise-inducing digital parts of the circuit. The ground and supply line bounce inherently generated in the digital output buffers by the presence of the parasitic bonding wire inductance not only can modify the reference levels of sensitive analog inputs, but can also couple capacitively or through the common substrate into the analog sections of the circuit.

Previous output buffers designs have attempted to reduce the digital switching noise by controlling the current in the output devices. This technique has certain limitations, since the maximum current (and thus the ground/power bounce) is undesirably strongly dependent on temperature, process, or power supply variations. Moreover, given a fixed shape of the output current, the propagation delay of the output buffer is dependent on the capacitive load.

As is apparent from the above discussion, a need exists for a constant propagation delay, low-noise digital output buffer for CMOS integrated circuits.

SUMMARY OF THE INVENTION

One object of the present invention is to provide a digital output buffer having a constant propagation delay under all process, temperature, and capacitive load variations. Another object of the present invention is to provide a digital output buffer which minimizes inductively-generated noise caused by bonding wires. Yet another object of the present invention is to provide a tri-state low-noise digital output buffer having nearly constant propagation delay under all process, temperature, and capacitive load conditions.

According to an embodiment of the present invention, a digital output buffer uses an RC delay line having more than one resistor and capacitor as a shaping circuit which drives an operational amplifier configured as voltage follower that drives an output load through an bonding wire having a significant non-zero inductance.

According to another embodiment of the present invention, taps from an RC delay line drive a distributed MOS source follower which provide a large drive current for quickly driving the output load voltage to within one threshold voltage of the final desired output voltage.

According to yet another embodiment of the present invention, taps from the RC delay line are used to drive the distributed MOS source follower while the final tap drives a rail-to-rail operational amplifier configured as a voltage follower. The majority of output load current is supplied by the distributed MOS source follower, so that the operational amplifier must only correct the output signal shape and drive the output to the relevant power supply voltage after the distributed MOS source follower cuts off one threshold voltage short of the final output voltage. In this embodiment, according to a preferred embodiment of an aspect of the present invention, the operational amplifier can includes a fully complementary adaptive biasing structure which allows large overdrive voltages for the output devices. The operational amplifier semi-circuit includes a differential pair to accept the V+ and V− inputs. The differential transistor having V− as its gate input (inverting device) has a quasi-constant bias current while the differential transistor (non-inverting device) having V+ as its gate input conducts a large current when V+ exceeds V−. The current through the inverting device is multiplied by a gain factor k by an output current mirror. Thus, the quiescent current is minimized without reducing the direct current driving capability.

According to still yet another embodiment of the present invention, the digital output buffer having an RC delay line, a distributed MOS source follower, and an operational amplifier is a tri-state output buffer. In that embodiment, the operational amplifier's output drivers are disabled and the power supplies are disconnected from the RC delay line and the distributed MOS source follower when the output buffer is not enabled.

These and other features and advantages of the present invention will be apparent from the Drawings as fully described in the Detailed Description of the Invention.

BRIEF DESCRIPTION OF THE DRAWINGS

In the Figures, like parts are designated by like numeric labels.

The Figures are more fully explained in the Detailed Description of the Invention.

DETAILED DESCRIPTION OF THE INVENTION

Figure 2:
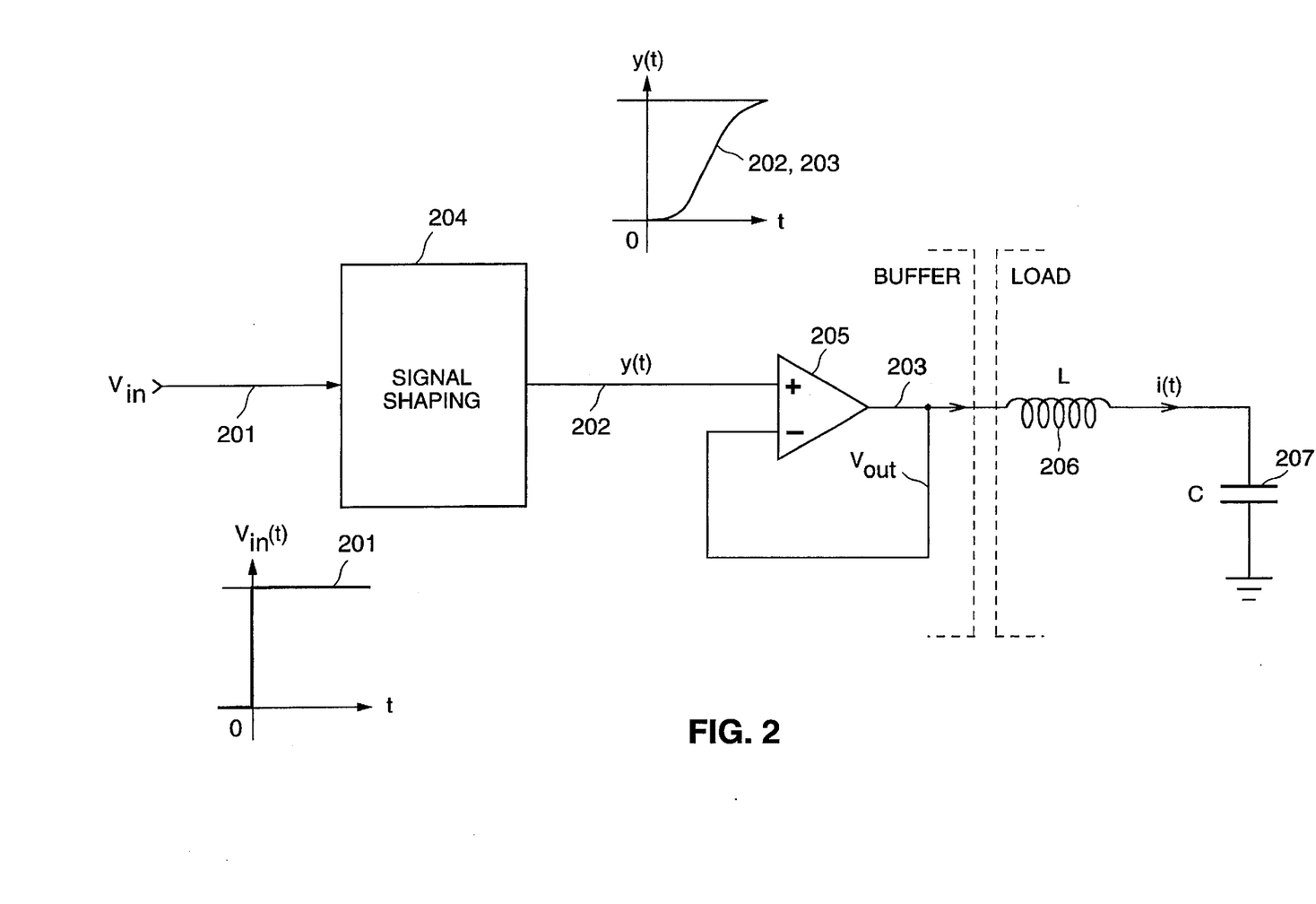
FIG. 2 illustrates an output buffer driving an output capacitance through a lead capacitance suitable for producing the waveforms of FIGS. 1A, 1B, and 1C.

The principle of the low noise digital output buffer according to the present invention is shown in FIG. 2. A signal shaping circuit 204 takes Vin 201 as input. The input 201 is typically generated inside the chip core and is a low drive strength ordinary digital signal having short rise times and fall times and thus sharp transition edges. The signal is intended for communication outside the chip. The input capacitance to the signal shaping 204 is preferably low. The signal shaping circuit 204 produces an output y(t) 202 which is smoothed, having edges which are not as sharp. The signal shaping circuit output 202 does not have enough current carrying capability to drive the output lead 206 and load capacitance 207 directly. Thus, operational amplifier 205 is configured as a voltage follower providing the controlled smooth voltage waveform by supplying a controlled current pulse at the buffer output Vout 203.

Figure 3:
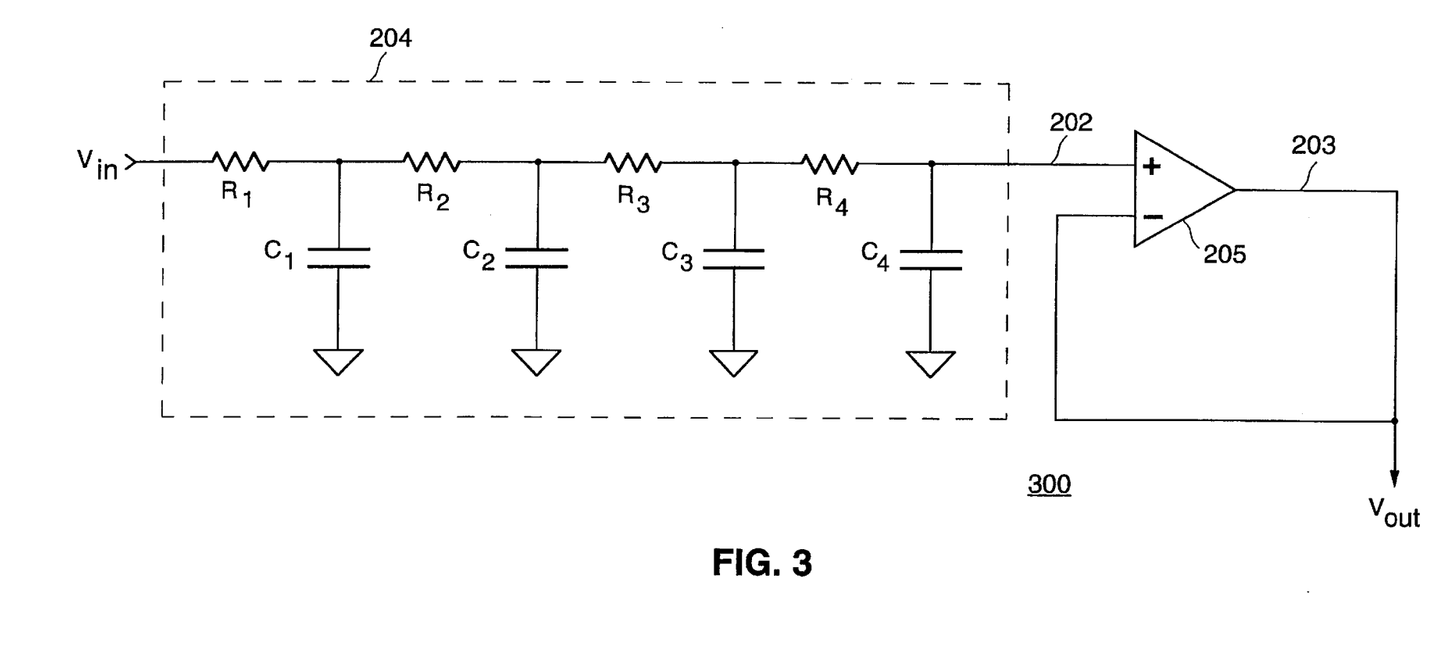
FIG. 3 illustrates a digital output buffer according to an embodiment of the present invention using a resistor-capacitor (RC) delay line implementing the signal shaping element of the output buffer illustrated in FIG. 2.

As illustrated in FIG. 3, an RC delay line is used as the shaping circuit 204 for the output signal Vout 203. Since the output lead 206 and load capacitance 207 is mainly capacitive, the output waveform 203 implicitly controls the output current i(t). Because the operational amplifier 205 is able to quickly track the output 203 from the signal shaping output 202, the propagation delay of the output buffer 300 is essentially determined by the transfer function of the RC delay line 204 and is only marginally affected by the process, temperature, and supply voltage corners (PVT conditions) or load conditions.

A low noise digital output buffer according to the present invention achieves low ground and power bounce and nearly constant propagation delay under all load and PVT conditions by controlling the shape of the output signal, closely resembling a "raised cosine". Since the load is mainly capacitive, this output waveform also controls the output current. An RC delay line is used as a shaping circuit 204, as illustrated in FIG. 3. For this implementation the delay is almost constant under all loads and only marginally affected by the PVT conditions, depending on the particular implementations of the resistors and capacitors. In CMOS chips, for example, gate capacitances of MOS transistors can be used to form the capacitances in the RC delay line. Gate capacitances of transistors are relatively precise per unit of area, thus making formation of a given size capacitance fairly accurate. The source and drain of either type MOS transistor are thus connected to either supply rail while its gate is used as a capacitor in an RC delay line. Alternatively, the drain and source diffusion material of MOS transistors can be used to form the capacitors. The resistances in the RC delay line can be formed using polysilicon or diffusion material, enabled pass transistors, partially or fully enabled complementary transmission gates having long channels, or otherwise.

In the embodiment illustrated in FIG. 3, straightforward implementation of the operational amplifier 205 acting as the current supplying buffer is difficult because the operational amplifier 205 must be very fast in response to changing input and must be able to supply large output currents on demand.

Figure 4:
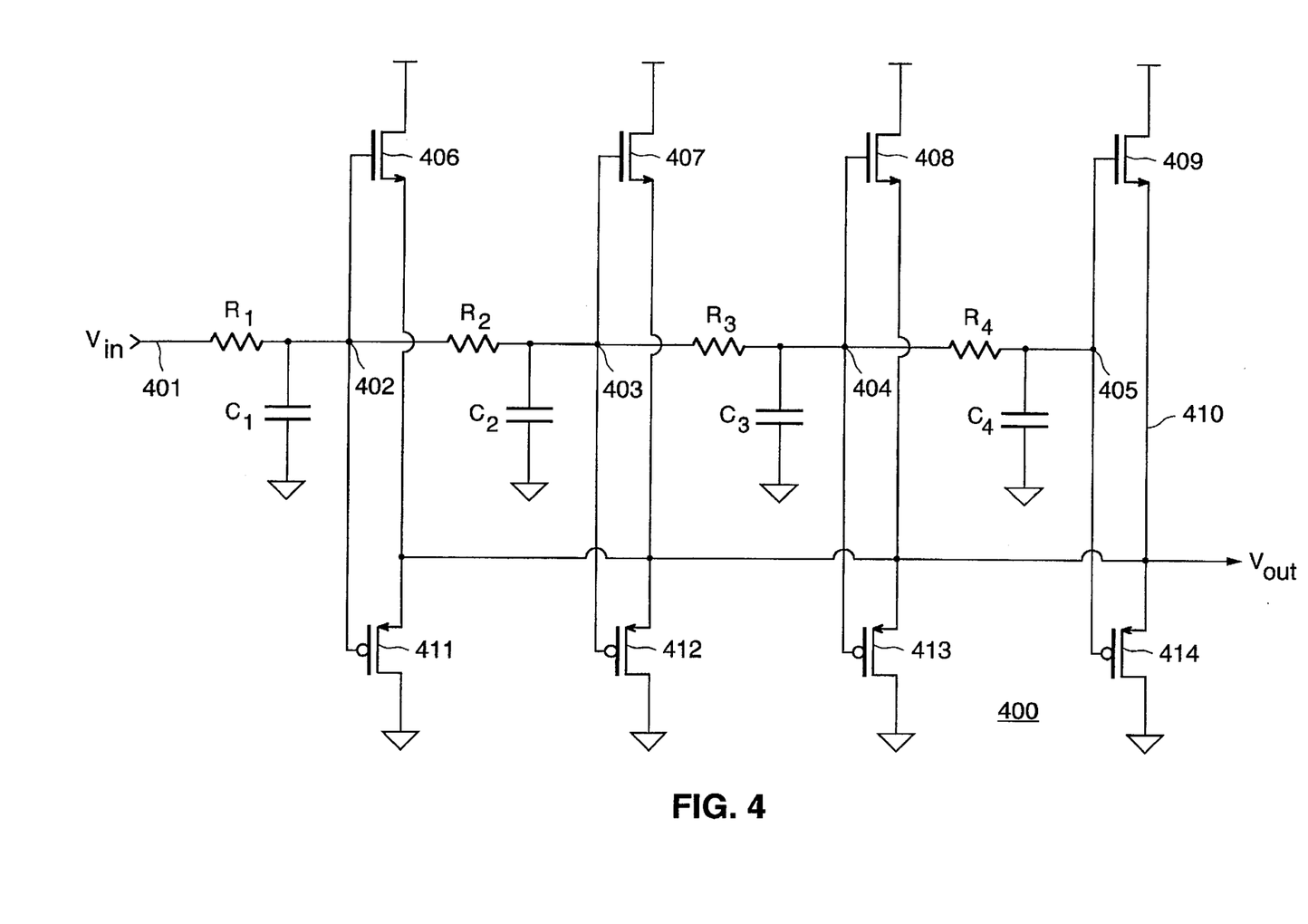
FIG. 4 illustrates a digital output buffer according to another embodiment of the present invention using source followers driven by taps of an RC delay line.

FIG. 4 illustrates another embodiment of a low-noise output buffer according to the present invention. In the circuit 400 in FIG. 4, taps from the RC delay line are used to drive MOS source followers. The input 401 is connected to an RC delay line as in the previous embodiment, however the amplification of the signal drive strength is performed by a distributed complementary MOS source follower having taps at each capacitor in the RC delay line. When the input Vin 401 goes from low to high abruptly, the node voltages at each of the taps 402–405 begins to rise. The voltage at tap 402 rises fastest and turns on the n-channel source follower 406 acting as a pullup transistor. The voltage at tap 403 rises more slowly than the voltage at the previous tap 402, turning on the source follower 407 more slowly. Similarly, transistors 408 and finally 409 are turned on as the entire delay line reaches the input voltage Vin, and all pullup transistors are turned on. However, N-channel devices 406–409 do not pull the output 410 all the way up to the positive supply voltage; rather, they stop one threshold voltage below the positive supply voltage. Similarly, on a falling edge of Vin 401, the P-channel devices 411–414 do not pull the output 410 all the way down to ground; but rather they stop one threshold voltage above ground. Thus another smaller amplifier (not shown in FIG. 4) may be used to push the output the last Vt threshold voltage to the appropriate supply voltage.

Although the source follower amplifier does not provide complete voltage swings by itself, it has several significant advantages. First, it helps to realize the optimal current profile illustrated in FIG. 1A in that the output current is increased gradually during low to high transitions.

Second, as the output is partially charged (to within one threshold voltage of the supply voltage), the amplifier cuts off, thereby allowing another charging device to decrease the output current in accordance with FIG. 1A. Standard CMOS inverting amplifiers do not have this property.

Third, unlike CMOS inverting amplifiers, the output devices of the non-inverting distributed source follower can be turned "off" through the same RC delayed path used to turn them "on" without causing simultaneous conduction through the pullup and pulldown transistors. Simultaneous conduction may lead to increased conducted and radiated noise, increased dynamic power dissipation, and output swing compression at higher frequencies. All source follower devices 406–409 and 411–414 are in cutoff when the output 410 is fully charged to either ground or Vdd. Thus, a transition from ground to Vdd on the input Vin 401 will cause pullup transistor 406 to begin turning on before the rising transition propagates down the RC delay line to the last tap 405. Therefore, the voltage at the last tap 405, which controls the pullup 409 and pulldown 414 could be zero volts while the first tap 402 is already near Vdd. In that case, the pull down transistor 414 is still cut-off because the output Vout 410 has not charged above the threshold voltage Vt of P-type pulldown transistor 414. As the input propagates down the delay line, more pullup transistors are turned on. The rising input propagates to the last tap 405 in time to cut-off transistor 414 before the output voltage Vout 410 rises enough to turn on transistor 414 so that significant simultaneous conduction can occur. Thus, simultaneous conduction is minimized using the source follower, while also minimizing the complexity of controlling the distributed buffer.

Figure 5:
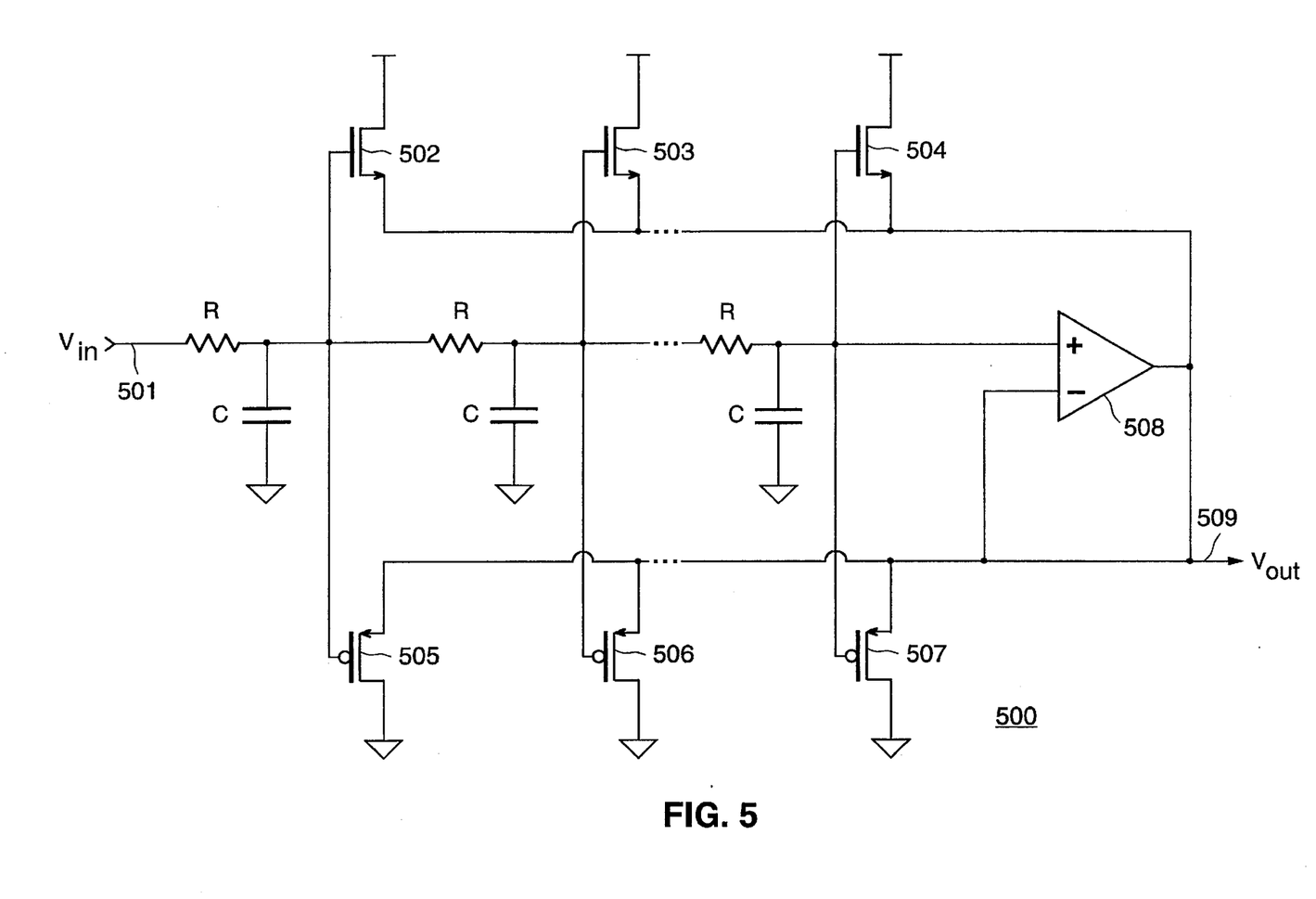
FIG. 5 illustrates a digital output buffer according to yet another embodiment of the present invention using source followers driven by taps of an RC delay line in conjunction with an operational amplifier.

Therefore, in order to form a non-inverting low-noise digital output buffer producing standard rail-to-rail voltage swings, in another embodiment of the present invention, an operational amplifier follower circuit is connected to the final tap of the RC delay line to drive the output to the appropriate supply rail voltage. FIG. 5 illustrates a digital output buffer 500 having the RC delay line, n-channel pullup source followers 502, 503, and 504, p-channel pulldown source followers 505, 506, and 507, and an operational amplifier 508 driving the output Vout 509.

The source followers are sized such that most of the load current is supplied from these distributed buffers 502–507; the operational amplifier 508 needs only to correct the output signal 509 shape and drive the output to its final voltage. This architecture greatly reduces the circuit's area and power dissipation. The operational amplifier is small relative to the distributed source follower.

This circuit architecture attempts to approximate the output current function illustrated in FIG. 1A. The gradual turn-on of the source followers described above accounts for the upward sloping current profile which occurs from time zero until time T/2. Referring to FIG. 1B, when the output voltage comes within one threshold voltage of the positive supply voltage, the distributed source follower is cut off, and the output buffer current decreases accordingly. The operational amplifier 508 decreases its output current as the output voltage approaches the positive supply rail, thereby producing the downward sloping portion of the current function 101 in FIG. 1A. For all output transitions, the source follower amplifier 502–507 begins to turn on before the operational amplifier 508 and turns off before the operational amplifier. The operational amplifier 508 to be used in accordance with this embodiment of the present invention can be of any type known in the art.

Figure 6:
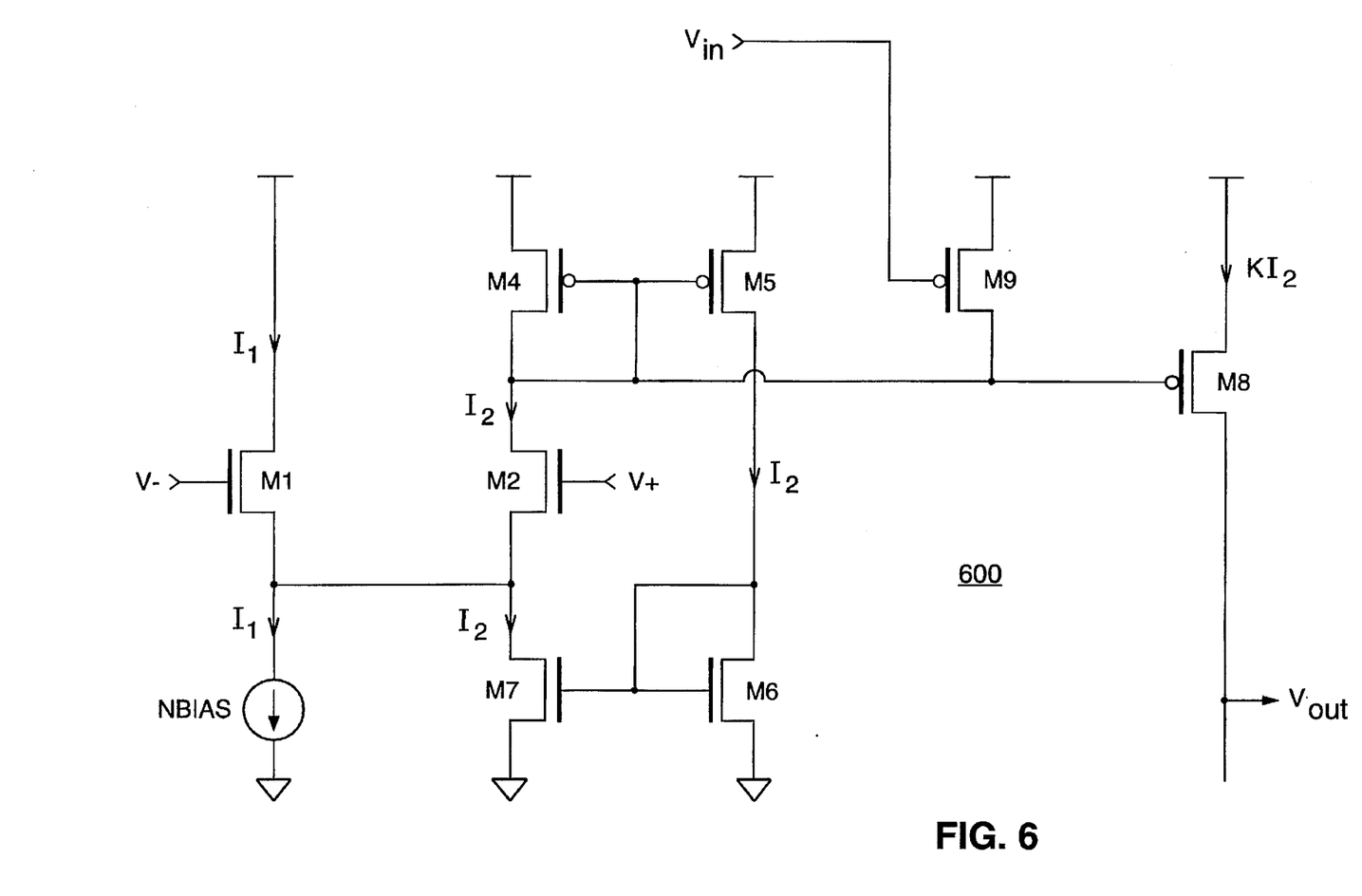
FIG. 6 illustrates a pullup semi-circuit of the operational amplifier according to an aspect of the present invention.

However, according to the preferred embodiment of an aspect of the present invention, the operational amplifier includes an adaptive biasing structure 600 shown in FIG. 6. This folded replica bias configuration allows large overdrive voltages for the output devices. Since transistor $M_5$ and the current mirror transistor $M_6$–$M_7$ replicate the $M_2$ drain current back into the common source node of the input transistor pair $M_1$–$M_2$, the input transistor $M_1$ has a quasi-constant bias current I1. Therefore, transistor $M_2$ operates in class AB, its drain current I2 being several times larger than the bias current I1 if the voltage difference between the V+ and V– inputs is large and positive. This current, $I_2$, is again multiplied by the factor k of the output current mirror formed by transistors $M_4$ and $M_8$.

Using this circuit, the quiescent current is minimized without reducing the direct current driving capability. The direct current driving capability is high because the bias current is multiplied once to generate I2 and again by factor k by the final driver current mirror stage. The PMOS transistor $M_9$ is driven directly by the input signal Vin, and keeps the pullup driver transistor $M_8$ turned off when the output Vout needs to go low. Moreover, this reduces the currents I2 through transistors M4, M2, M7 and M5, M6 to zero when the output Vout is going low, thus minimizing static power dissipation. This is particularly important for high speed output voltage transients that induce a displacement current through the transistor $M_8$ gate-to-drain capacitance.

Figure 7:
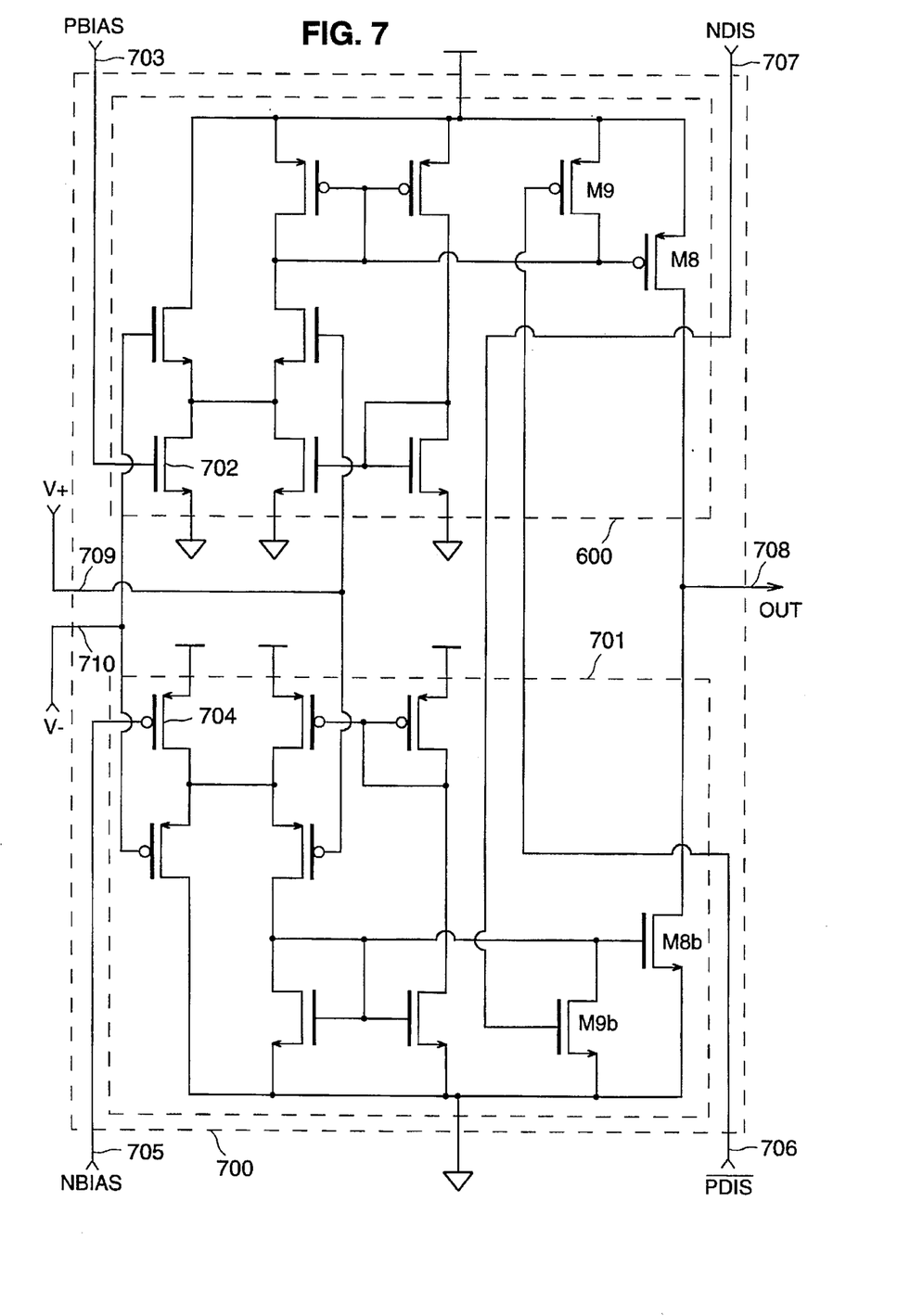
FIG. 7 illustrates the fully complementary operational amplifier according to another aspect of the present invention.

A complementary semi-circuit with an NMOS output transistor is needed to implement the other half of the operational amplifier, as illustrated in FIG. 7. The output buffer has been designed for a nominal 10 ns propagation delay in a 0.8 µm CMOS process. The bias current was set to $I_{bias}$=200 µA, which determines a dc power dissipation of 3 mW per output buffer using a 5 V supply.

FIG. 7 illustrates the preferred embodiment of the operational amplifier used in the output buffers according to the present invention. The operational amplifier 700 includes a pullup semi-circuit 600 (as illustrated in FIG. 6) as well as the pulldown semi-circuit 701. The pullup semi-circuit 600 is biased by an n-channel bias transistor controlled by a pullup bias voltage 703. The pulldown semi-circuit 701 is biased by a p-channel bias transistor 704 controlled by a pulldown bias voltage 705. The pullup semi-circuit 600 is disabled by deasserting pullup disabling signal 706. The pulldown semi-circuit 701 is disabled by asserting pulldown disabling signal 707. The semi-circuits share the output 708, and the V+ 709, and V– 710 inputs.

Figure 8:
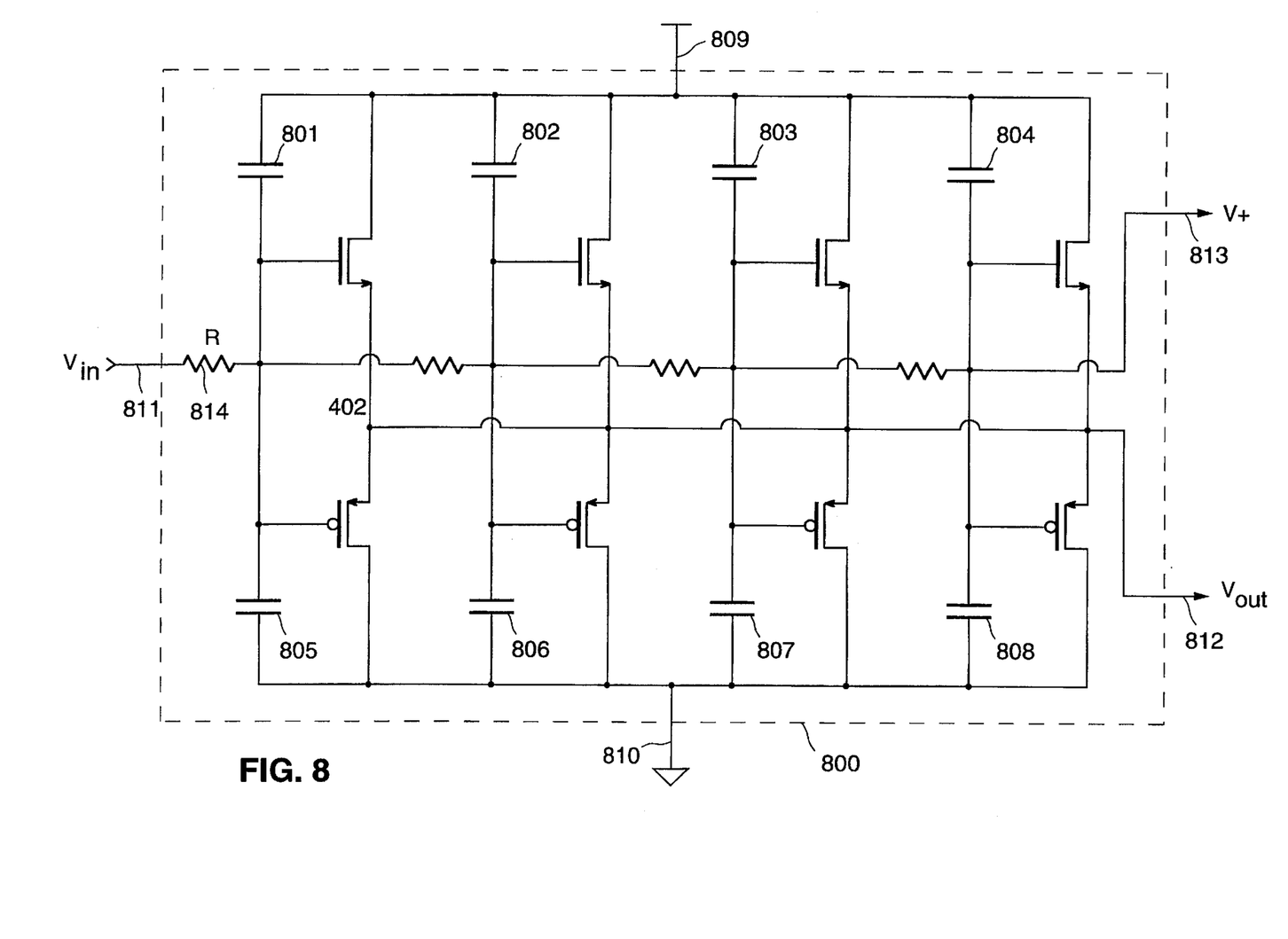
FIG. 8 illustrates source followers driven by taps of an RC delay line suitable for use with the operational amplifier illustrated in FIG. 7 according to yet another aspect of the present invention.

FIG. 8 illustrates the preferred embodiment of the RC delay line and distributed source follower amplifier 800 used in the output buffers according to the present invention. Capacitors 801 through 804 are coupled to the positive supply terminal 809 while capacitors 805 through 808 are coupled to ground terminal 810. The output buffer input Vin 811 is connected to the first resistor 814 in the RC delay line. V+ output 813 is the final tap of the RC delay line, and Vout 812 is the output of the distributed source follower.

Figure 9:
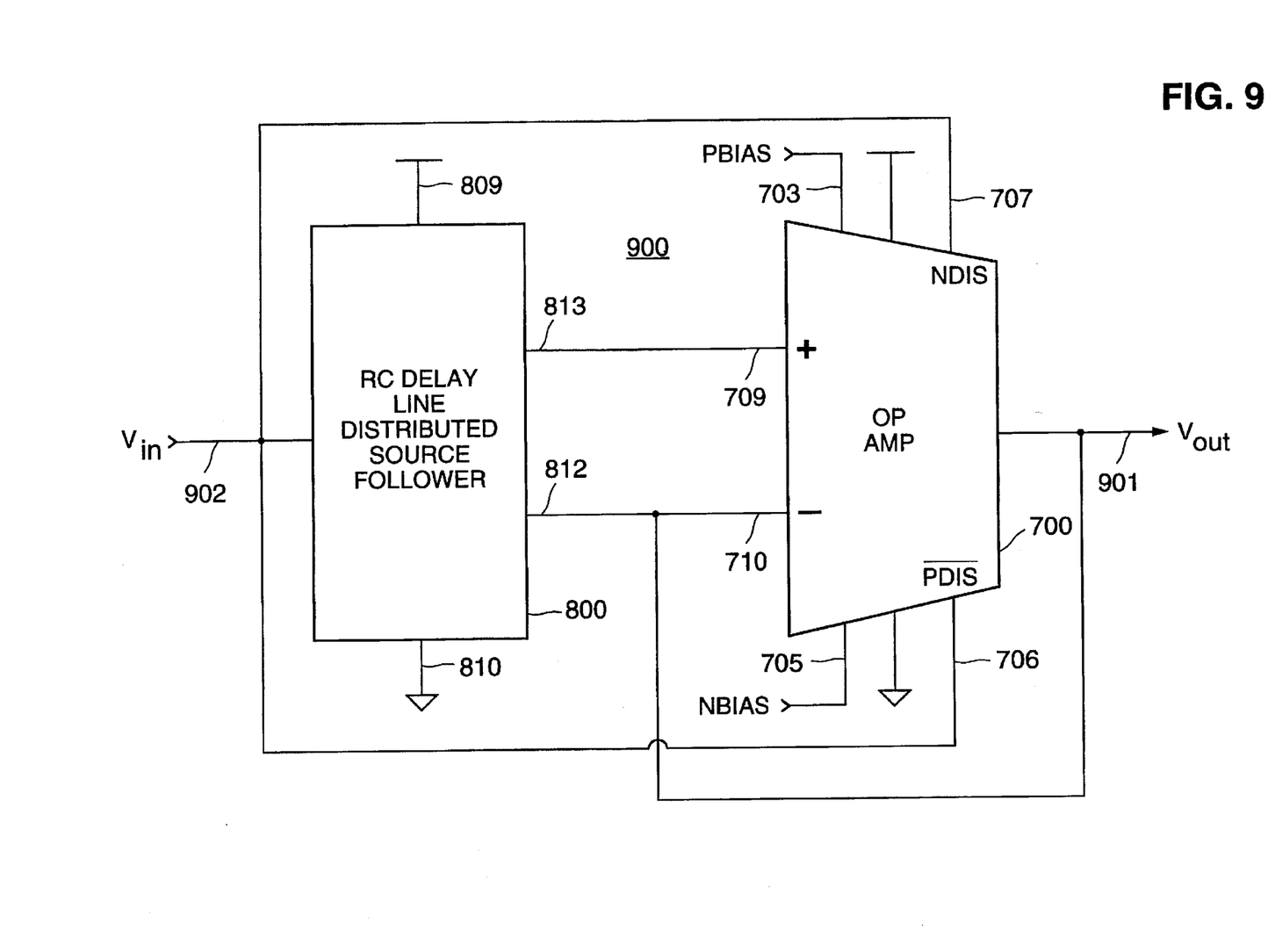
FIG. 9 illustrates a digital output buffer according to an embodiment of the present invention using the operational amplifier of FIG. 7 and the source followers illustrated in FIG. 5.

FIG. 9 illustrates an embodiment of the present invention using the RC delay line and distributed source follower amplifier 800 from FIG. 8 and the operational amplifier 700 from FIG. 7.

Figure 10:
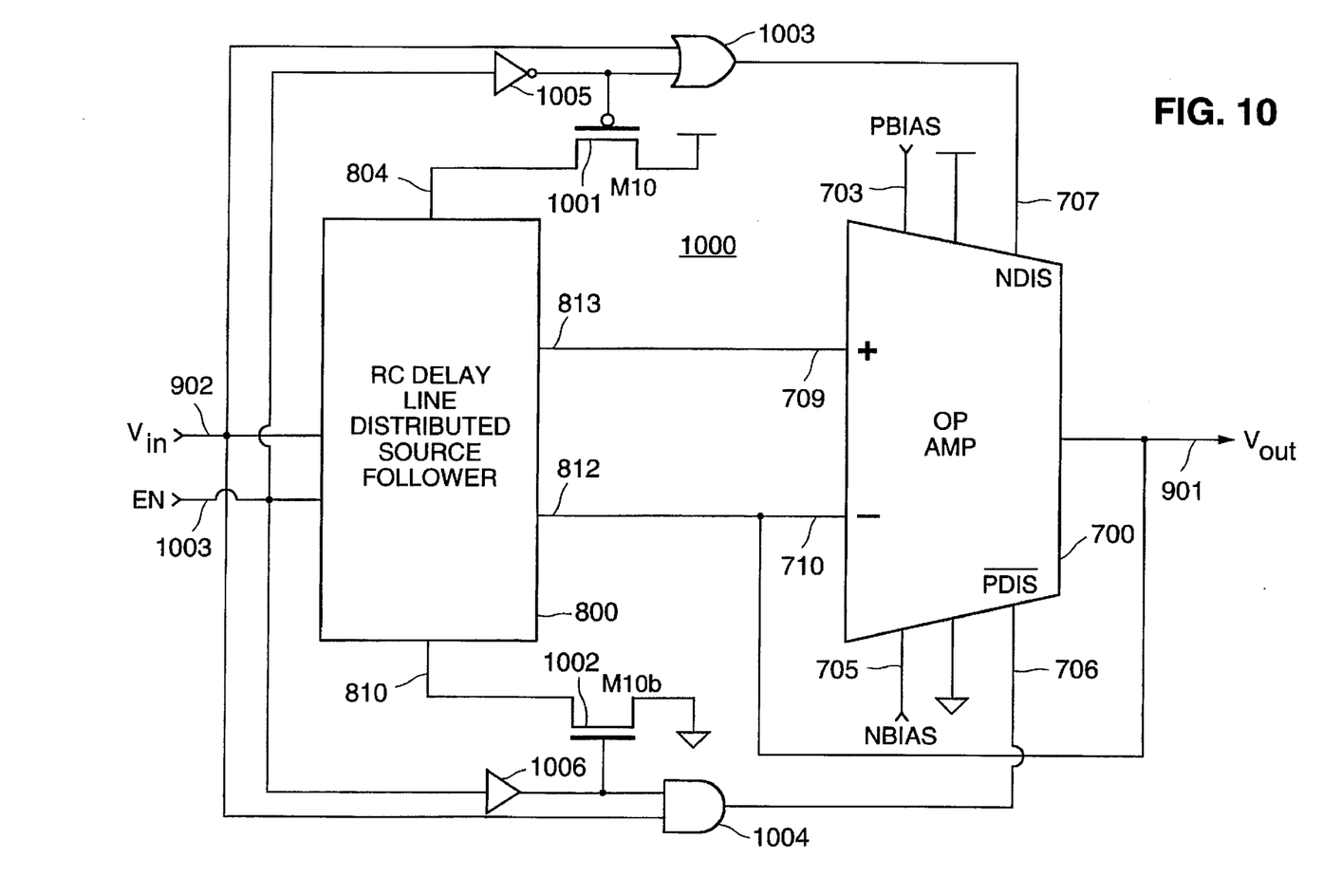
FIG. 10 illustrates a tri-state digital output buffer according to another embodiment of the present invention using the operational amplifier of FIG. 7 and the source followers illustrated in FIG. 5, in which the power to the RC delay line having source follower taps is cut off which the output buffer is disabled.

FIG. 10 illustrates a tri-state embodiment of the present invention using the RC delay line and distributed source follower amplifier 800 from FIG. 8 and the operational amplifier 700 from FIG. 7. In the high impedance state, the enable input, EN 1005, is "LOW", thus the cutoff transistors $M_9$ and $M_{9b}$ (FIG. 7) are both holding the output pair $M_8$ and $M_{8b}$ "OFF", and the series transistors $M_{10}$ 1001 and $M_{10b}$ 1002 are "OFF" decoupling the distributed buffer 800 from the power supplies. The pulldown disable control signal 707 is generated by the OR gate 1003 which disables the pulldown semi-circuit of the operational amplifier 700 when the digital input Vin 902 is high or the enable input EN 1005 is low. The pullup disable control signal 706 is generated by the AND gate 1004 which disables the pullup semi-circuit when the digital input Vin 902 is low or the enable input EN 1005 is low.

While the present invention has been disclosed with particular reference to its alternative and presently preferred embodiments, those embodiments are presented by way of example, not by way of limitation. Those of ordinary skill in the art would be enabled by this disclosure to add to or modify the embodiments of the present invention in various ways as needed and still be within the scope and spirit of the present invention as recited in the appended claims. Accordingly, various changes and modifications which are obvious to a person skilled in the art to which the invention pertains are deemed to lie within the spirit and scope of the invention as claimed.

What is claimed is:

1. A digital output buffer comprising:
    an operational amplifier having a non-inverting op amp input, an inverting op amp input, and an op amp output, wherein the op amp output is connected to a buffer output and the inverting op amp input;
    a plurality of resistors including a first resistor and a last resistor, wherein each resistor has a first terminal and a second terminal, wherein the plurality of resistors are connected in series, wherein the first resistor first terminal is connected to a buffer input, wherein the last resistor second terminal is connected to the non-inverting op amp input; and
    a plurality of first capacitors corresponding to the plurality of resistors, wherein each first capacitor has a first terminal and a second terminal, wherein each resistor second terminal is connected to a corresponding first capacitor first terminal from among the plurality of first capacitors.

2. A digital output buffer as in claim 1,
    wherein each first capacitor second terminal is connected to a ground supply node.

3. A digital output buffer as in claim 2, further comprising:
    a plurality of second capacitors corresponding to the plurality of resistors, wherein each second capacitor has a first terminal and a second terminal, wherein each resistor second terminal is connected to a corresponding second capacitor second terminal from among the plurality of second capacitors.

4. A digital output buffer as in claim 3, wherein each second capacitor first terminal is connected to a power supply node.

5. A digital output buffer as in claim 4, wherein the plurality of first capacitors comprise a plurality of N-channel transistors each having a gate providing the first capacitor first terminal and a source and drain providing the first capacitor second terminal; and wherein the plurality of second capacitors comprise a plurality of P-channel transistors each having a gate providing the second capacitor second terminal and a source and drain providing the second capacitor first terminal.

6. A digital output buffer comprising:

an operational amplifier having a non-inverting op amp input, an inverting op amp input, and an op amp output, wherein the op amp output is connected to a buffer output and the inverting op amp input;

a plurality of resistors including a first resistor and a last resistor, wherein each resistor has a first terminal and a second terminal, wherein the plurality of resistors are connected in series, wherein the first resistor first terminal is connected to a buffer input, wherein the last resistor second terminal is connected to the non-inverting op amp input;

a plurality of first capacitors corresponding to the plurality of resistors, wherein each first capacitor has a first terminal and a second terminal, wherein each resistor second terminal is connected to a corresponding first capacitor first terminal from among the plurality of first capacitors;

a plurality of N-channel MOS shaping transistors corresponding to the plurality of resistors, wherein each N-channel MOS shaping transistor gate is connected to a corresponding resistor second terminal from among the plurality of resistors, wherein each N-channel MOS shaping transistor source is connected to the buffer output; and a plurality of P-channel MOS shaping transistors corresponding to the plurality of resistors, wherein each P-channel MOS shaping transistor gate is connected to a corresponding resistor second terminal from among the plurality of resistors, wherein each P-channel MOS shaping transistor source is connected to the buffer output.

7. A digital output buffer comprising:

a plurality of resistors including a first resistor and a last resistor, wherein each resistor has a first terminal and a second terminal, wherein the plurality of resistors are connected in series, wherein the first resistor first terminal is connected to a buffer input, wherein the last resistor second terminal is connected to a non-inverting op amp input;

a plurality of first capacitors corresponding to the plurality of resistors, wherein each first capacitor has a first terminal and a second terminal, wherein each resistor second terminal is connected to a corresponding first capacitor first terminal from among the plurality of first capacitors;

a plurality of N-channel MOS shaping transistors corresponding to the plurality of resistors, wherein each N-channel MOS shaping transistor gate is connected to a corresponding resistor second terminal from among the plurality of resistors, wherein each N-channel MOS shaping transistor source is connected to a buffer output;

a plurality of P-channel MOS shaping transistors corresponding to the plurality of resistors, wherein each P-channel MOS shaping transistor gate is connected to a corresponding resistor second terminal from among the plurality of resistors, wherein each P-channel MOS shaping transistor source is connected to the buffer output;

a P-channel power switch transistor having a source, a gate, and a drain, wherein the P-channel power switch transistor source is connected to a positive power supply, wherein the P-channel power switch transistor drain is connected to each of the N-channel MOS shaping drains of the plurality of N-channel MOS shaping transistors, wherein the P-channel power switch transistor gate is connected to an inverted enable input; and an N-channel power switch transistor having a source, a gate, and a drain, wherein the N-channel power switch transistor source is connected to a negative power supply, wherein the N-channel power switch transistor drain is connected to each of the P-channel MOS shaping drains of the plurality of P-channel MOS shaping transistors, wherein the N-channel power switch transistor gate is connected to an enable input.

8. A digital output buffer as in claim 7, wherein each first capacitor second terminal is connected to a ground supply node.

9. A digital output buffer as in claim 8, further comprising:

a plurality of second capacitors corresponding to the plurality of resistors, wherein each second capacitor has a first terminal and a second terminal, wherein each resistor second terminal is connected to a corresponding second capacitor second terminal from among the plurality of second capacitors.

10. A digital output buffer as in claim 9, wherein each second capacitor first terminal is connected to a power supply node.

11. A digital output buffer as in claim 10, wherein the plurality of first capacitors comprise a plurality of N-channel transistors each having a gate providing the first capacitor first terminal and a source and drain providing the first capacitor second terminal; and wherein the plurality of second capacitors comprise a plurality of P-channel transistors each having a gate providing the second capacitor second terminal and a source and drain providing the second capacitor first terminal.

12. A digital output buffer comprising:

an operational amplifier having a non-inverting op amp input, an inverting op amp input, and an op amp output, wherein the op amp output is connected to a buffer output and the inverting op amp input;

a plurality of resistors including a first resistor and a last resistor, wherein each resistor has a first terminal and a second terminal, wherein the plurality of resistors are connected in series, wherein the first resistor first terminal is connected to a buffer input, wherein the last resistor second terminal is connected to the non-inverting op amp input;

a plurality of first capacitors corresponding to the plurality of resistors, wherein each first capacitor has a first terminal and a second terminal, wherein each resistor second terminal is connected to a corresponding first capacitor first terminal from among the plurality of first capacitors;

a plurality of N-channel MOS shaping transistors corresponding to the plurality of resistors, wherein each N-channel MOS shaping transistor gate is connected to a corresponding resistor second terminal from among the plurality of resistors, wherein each N-channel MOS shaping transistor source is connected to the buffer output; and a plurality of P-channel MOS shaping transistors corresponding to the plurality of resistors, wherein each P-channel MOS shaping transistor gate is connected to a corresponding resistor second terminal from among the plurality of resistors, wherein each P-channel MOS shaping transistor source is connected to the buffer output.

13. A digital output buffer as in claim 12, wherein the operational amplifier comprises:

a P-channel driver transistor having a source, a gate, and a drain, wherein the drain is connected to the op amp output;

a P-channel disabling transistor having a source, a gate, and a drain, wherein the drain is connected to the P-channel driver gate, wherein the gate is connected to the buffer input;

an N-channel driver transistor having a source, a gate, and a drain, wherein the drain is connected to the op amp output; and an N-channel disabling transistor having a source, a gate, and a drain, wherein the drain is connected to the N-channel driver gate, wherein the gate is connected to the buffer input.

14. A digital output buffer as in claim 12, wherein the operational amplifier further comprises:

a P-channel pullup current master transistor having a source, a gate, and a drain, wherein the drain and gate are connected to the P-channel driver gate;

a P-channel pullup current slave transistor having a source, a gate, and a drain, wherein the gate is connected to the P-channel driver gate;

an N-channel pulldown current master transistor having a source, a gate, and a drain, wherein the drain and gate are connected to the N-channel driver gate; and an N-channel pulldown current slave transistor having a source, a gate, and a drain, wherein the gate is connected to the N-channel driver gate.

15. A digital output buffer as in claim 14, wherein the operational amplifier further comprises:

an N-channel pullup current master transistor having a source, a gate, and a drain, wherein the gate and drain are connected to the P-channel pullup current slave drain;

an N-channel pullup current slave transistor having a source, a gate, and a drain, wherein the gate is connected to the P-channel pullup current slave drain;

a P-channel pulldown current master transistor having a source, a gate, and a drain, wherein the gate and drain are connected to the N-channel pulldown current slave drain; and a P-channel pulldown current slave transistor having a source, a gate, and a drain, wherein the gate is connected to the N-channel pulldown current slave drain.

16. A digital output buffer as in claim 15, wherein the operational amplifier further comprises:

a non-inverting N-channel pullup differential transistor having a source, a gate, and a drain, wherein the gate is connected to the non-inverting op amp input, wherein the drain is connected to the P-channel driver gate, wherein the source is connected to the N-channel pullup current slave drain;

an inverting N-channel pullup differential transistor having a source, a gate, and a drain, wherein the gate is connected to the inverting op amp input, wherein the source is connected to the N-channel pullup current slave drain;

a non-inverting P-channel pulldown differential transistor having a source, a gate, and a drain, wherein the gate is connected to the non-inverting op amp input, wherein the drain is connected to the N-channel driver gate, wherein the source is connected to the P-channel pulldown current slave drain; and an inverting P-channel pulldown differential transistor having a source, a gate, and a drain, wherein the gate is connected to the inverting op amp input, wherein the source is connected to the P-channel pulldown current slave drain.

17. A digital output buffer as in claim 16, wherein the operational amplifier further comprises:

an N-channel pullup bias transistor having a source, a gate, and a drain, wherein the gate is connected to a pullup bias voltage, wherein the drain is connected to the inverting N-channel pullup differential source; and an P-channel pulldown bias transistor having a source, a gate, and a drain, wherein the gate is connected to a pulldown bias voltage, wherein the drain is connected to the inverting P-channel pulldown differential source.

18. A digital output buffer as in claim 17, wherein a positive supply voltage is connected to the P-channel driver source, the P-channel disabling source, the P-channel pullup current master source, the P-channel pulldown current master source, the P-channel pulldown current slave source, and the P-channel pulldown bias source, and wherein a negative supply voltage is connected to the N-channel driver source, the N-channel disabling source, the N-channel pullup current master source, the N-channel pulldown current master source, the N-channel pulldown current slave source, and the N-channel pulldown bias source.

19. A digital output buffer as in claim 12, further comprising:

a P-channel power switch transistor having a source, a gate, and a drain, wherein the source is connected to a positive power supply, wherein the drain is connected to each of the N-channel MOS shaping drains of the plurality of N-channel MOS shaping transistors, wherein the gate is connected to an inverted enable input; and an N-channel power switch transistor having a source, a gate, and a drain, wherein the source is connected to a negative power supply, wherein the drain is connected to each of the P-channel MOS shaping drains of the plurality of P-channel MOS shaping transistors, wherein the gate is connected to an enable input.

20. A digital output buffer as in claim 12, wherein each first capacitor second terminal is connected to a ground supply node.

21. A digital output buffer as in claim 20, further comprising:

a plurality of second capacitors corresponding to the plurality of resistors, wherein each second capacitor has a first terminal and a second terminal, wherein each resistor second terminal is connected to a corresponding second capacitor second terminal from among the plurality of second capacitors.

22. A digital output buffer as in claim 21, wherein each second capacitor first terminal is connected to a power supply node.

23. A digital output buffer as in claim 22, wherein the plurality of first capacitors comprise a plurality of N-channel transistors each having a gate providing the first capacitor first terminal and a source and drain providing the first capacitor second terminal; and wherein the plurality of second capacitors comprise a plurality of P-channel transistors each having a gate providing the second capacitor second terminal and a source and drain providing the second capacitor first terminal.

24. A digital output buffer as in claim 12, wherein the operational amplifier comprises:

a P-channel driver transistor having a source, a gate, and a drain, wherein the drain is connected to the op amp output;

a P-channel disabling transistor having a source, a gate, and a drain, wherein the drain is connected to the P-channel driver gate, wherein the gate is connected to an inverted pullup disable signal;

an N-channel driver transistor having a source, a gate, and a drain, wherein the drain is connected to the op amp output; and an N-channel disabling transistor having a source, a gate, and a drain, wherein the drain is connected to the N-channel driver gate, wherein the gate is connected to a non-inverted pulldown disable signal.

25. A digital output buffer as in claim 24, further comprising:

an OR gate having the non-inverted pulldown disable signal as output and having the buffer input and an inverted enable signal as inputs; and an AND gate having the inverted pullup disable signal as output and having the buffer input and a non-inverted enable signal as inputs.

26. A digital output buffer as in claim 25, further comprising:

a P-channel power switch transistor having a source, a gate, and a drain, wherein the source is connected to a positive power supply, wherein the drain is connected to each of the N-channel MOS shaping drains of the plurality of N-channel MOS shaping transistors, wherein the gate is connected to the inverted enable signal; and an N-channel power switch transistor having a source, a gate, and a drain, wherein the source is connected to a negative power supply, wherein the drain is connected to each of the P-channel MOS shaping drains of the plurality of P-channel MOS shaping transistors, wherein the gate is connected to a non-inverted enable signal.

* * * * *